(12) United States Patent
Ryu et al.

(10) Patent No.: US 9,716,071 B2
(45) Date of Patent: Jul. 25, 2017

(54) SEMICONDUCTOR DEVICE REDISTRIBUTION LAYER WITH NARROW TRACE WIDTH RELATIVE TO PASSIVATION LAYER OPENING

(71) Applicant: Amkor Technology, Inc., Tempe, AZ (US)

(72) Inventors: Ji Yeon Ryu, Seoul (KR); Byong Jin Kim, Gyeonggi-do (KR); Jae Beum Shim, Incheon (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/810,664

(22) Filed: Jul. 28, 2015

(65) Prior Publication Data

US 2016/0027747 A1    Jan. 28, 2016

(30) Foreign Application Priority Data

Jul. 28, 2014   (KR) .................. 10-2014-0095711

(51) Int. Cl.
*H01L 23/31*     (2006.01)
*H01L 23/00*     (2006.01)

(52) U.S. Cl.
CPC .......... *H01L 24/05* (2013.01); *H01L 23/3171* (2013.01); *H01L 23/3114* (2013.01);
(Continued)

(58) Field of Classification Search
CPC ..... H01L 24/05; H01L 23/3171; H01L 24/13; H01L 24/11; H01L 23/00; H01L 23/31;
(Continued)

(56) References Cited

U.S. PATENT DOCUMENTS 5,517,515 A     5/1996   Spall
8,299,616 B2 *  10/2012  Chuang .................. H01L 24/11
                                                    257/758
(Continued)

FOREIGN PATENT DOCUMENTS

JP       2010-092930 A     4/2010
KR    1020090080752 A     7/2009
(Continued)

OTHER PUBLICATIONS

Korean Office Action of the Korean Patent Application No. 10-2012-0095947.
(Continued)

*Primary Examiner* — Alexander Oscar Williams
(74) *Attorney, Agent, or Firm* — McAndrews, Held & Malloy, Ltd.

(57) ABSTRACT

A semiconductor device with fine pitch redistribution layers is disclosed and may include a semiconductor die with a bond pad and a first passivation layer comprising an opening above the bond pad. A redistribution layer (RDL) may be formed on the passivation layer with one end of the RDL electrically coupled to the bond pad and a second end comprising a connection region. A second passivation layer may be formed on the RDL with an opening for the connection region of the RDL. An under bump metal (UBM) may be formed on the connection region of the RDL and a portion of the second passivation layer. A bump contact may be formed on the UBM, wherein a width of the RDL is less than a width of the opening in the second passivation layer and may be constant from the bond pad through at least a portion of the opening.

24 Claims, 17 Drawing Sheets

(52) U.S. Cl.
CPC .......... *H01L 23/3192* (2013.01); *H01L 24/13* (2013.01); *H01L 2224/02351* (2013.01); *H01L 2224/02375* (2013.01); *H01L 2224/0401* (2013.01); *H01L 2224/05008* (2013.01); *H01L 2224/05015* (2013.01); *H01L 2224/05018* (2013.01); *H01L 2224/05555* (2013.01); *H01L 2224/05557* (2013.01); *H01L 2224/05558* (2013.01); *H01L 2224/05569* (2013.01); *H01L 2224/05582* (2013.01); *H01L 2224/131* (2013.01); *H01L 2224/13007* (2013.01); *H01L 2224/13017* (2013.01); *H01L 2224/13022* (2013.01); *H01L 2224/13024* (2013.01); *H01L 2224/13082* (2013.01)

(58) Field of Classification Search
CPC ..... H01L 2224/0237; H01L 2924/2064; H01L 2224/04401
USPC ......... 257/737, 738, 734, 782, 780; 438/613
See application file for complete search history.

(56) References Cited

U.S. PATENT DOCUMENTS

| | | | | |
|---|---|---|---|---|
| 9,224,680 | B2 * | 12/2015 | Chen | ................. H01L 23/49833 |
| 2005/0017355 | A1 * | 1/2005 | Chou | ...................... H01L 24/03 |
| | | | | 257/738 |
| 2009/0184411 | A1 | 7/2009 | Chung | |
| 2009/0283905 | A1 * | 11/2009 | Huang | .................... H01L 24/10 |
| | | | | 257/737 |
| 2012/0129334 | A1 | 5/2012 | Chung | |
| 2013/0147034 | A1 * | 6/2013 | Chen | ..................... H01L 23/293 |
| | | | | 257/737 |
| 2013/0228897 | A1 * | 9/2013 | Chen | ....................... H01L 24/05 |
| | | | | 257/621 |
| 2014/0061900 | A1 * | 3/2014 | Park | ........................ H01L 24/06 |
| | | | | 257/737 |
| 2015/0235976 | A1 * | 8/2015 | Yew | ........................ H01L 24/13 |
| | | | | 257/747 |

FOREIGN PATENT DOCUMENTS

| | | |
|---|---|---|
| KR | 10-2009-0114678 | 11/2009 |
| KR | 10-2011-0114155 A | 10/2011 |
| KR | 1020100033643 | 10/2011 |
| KR | 10-1121827 | 2/2012 |

OTHER PUBLICATIONS

Korean Office Action of the Korean Patent Application No. 10-2014-0095711 dated Feb. 25, 2016.
Korean Office Action of the Korean Patent Application No. 10-2014-0095711 dated Aug. 19, 2016.
Korean Notice of Allowance of the Korean Patent Application No. 10-2014-0095711 dated Nov. 18, 2016.

* cited by examiner

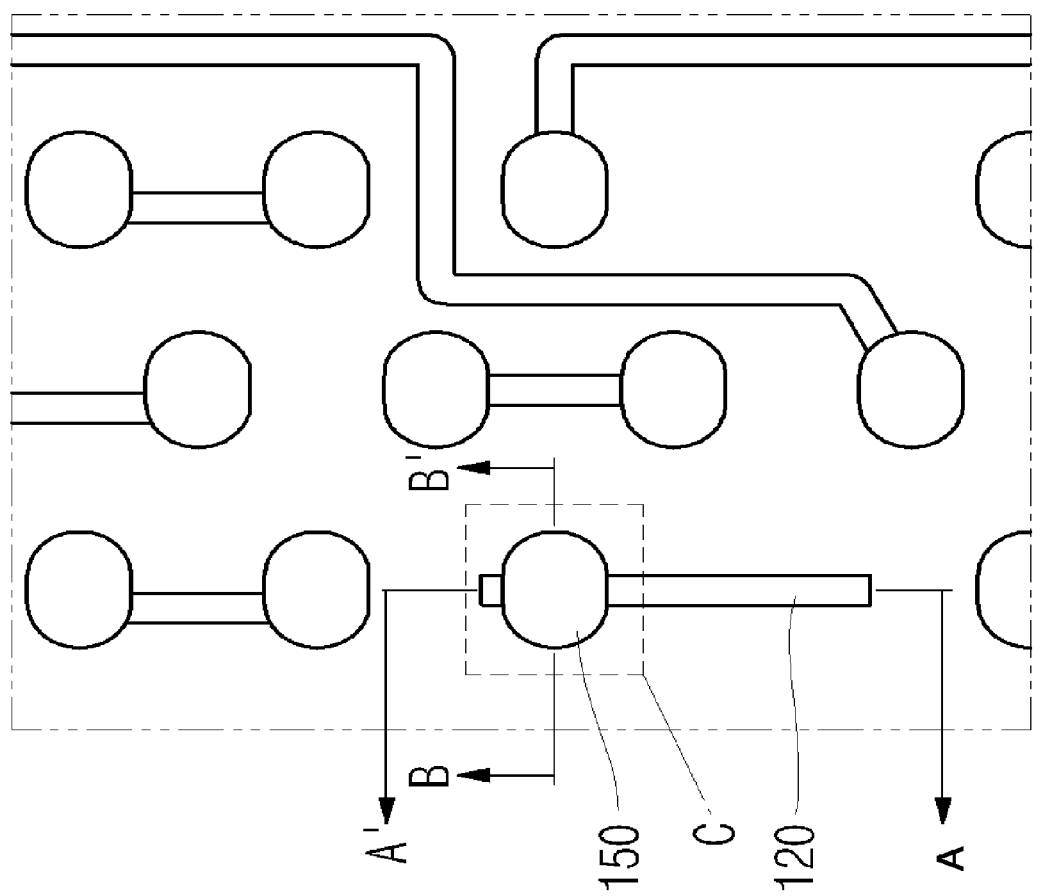

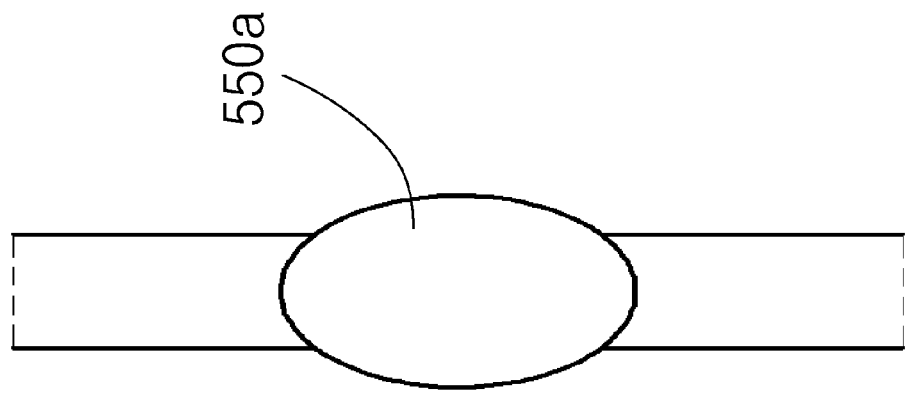
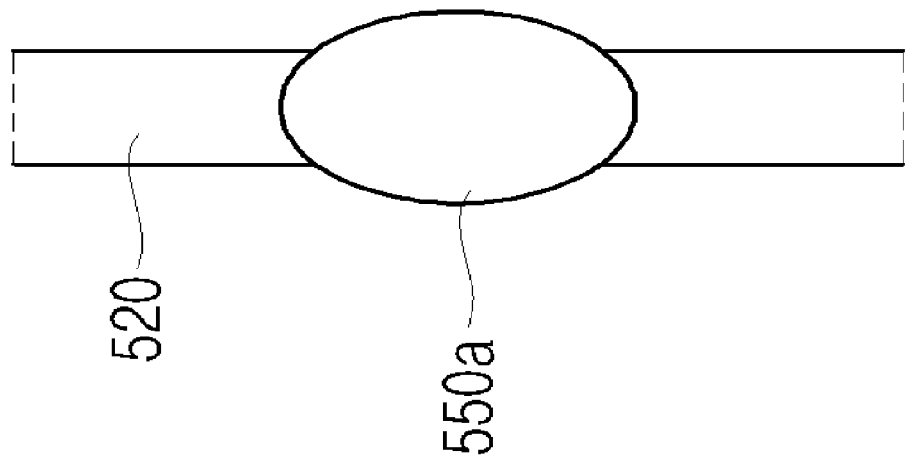
FIG. 8A

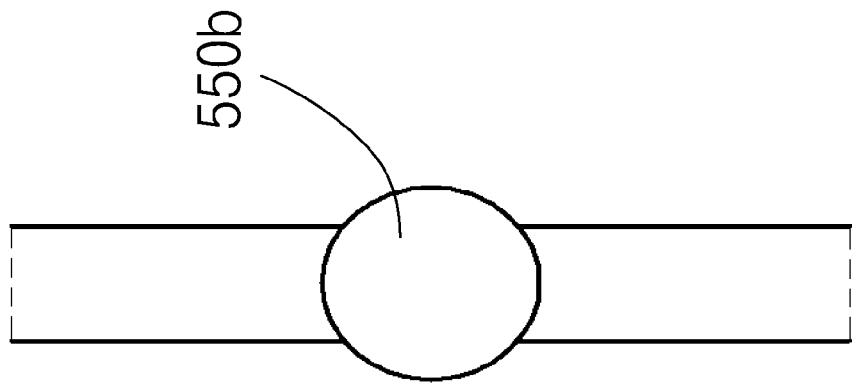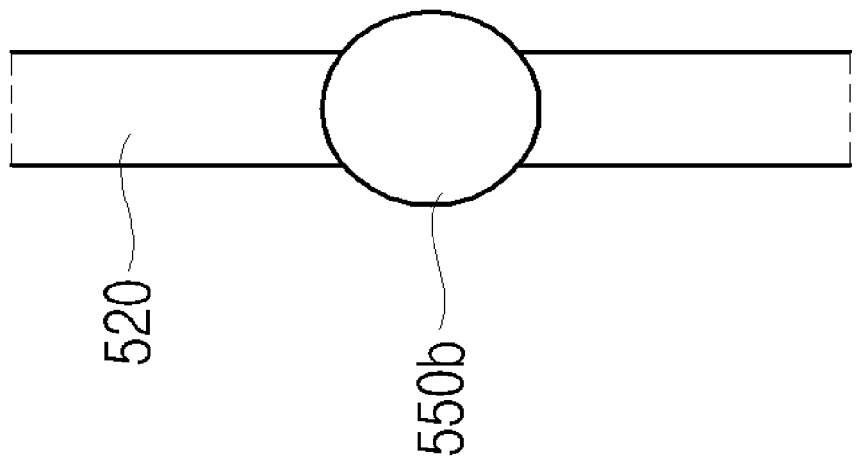
FIG. 8B

SEMICONDUCTOR DEVICE REDISTRIBUTION LAYER WITH NARROW TRACE WIDTH RELATIVE TO PASSIVATION LAYER OPENING

CROSS REFERENCE TO RELATED APPLICATIONS

The present application makes reference to, claims priority to, and claims the benefit of Korean Patent Application No. 10-2014-0095711, filed on Jul. 28, 2014, the contents of which are hereby incorporated herein by reference, in their entirety.

FIELD

Certain example embodiments of the disclosure relate to semiconductor chip packaging. More specifically, certain example embodiments of the disclosure relate to a semiconductor device with fine pitch redistribution layers.

BACKGROUND

Semiconductor packages are used in a wide variety of products. In addition, according to the recent trend toward slim, light, and compact products, in order to reduce the size of the semiconductor package, growing attention is being paid to a flip chip package having bumps directly formed on a surface of a semiconductor die or a TSV package having a through silicon via (TSV) formed in a bond pad of a semiconductor die and a solder bump formed in the TSV.

In general, the flip chip package or the TSV package includes a redistribution layer (RDL) connected to a bond pad of a semiconductor die and redistributing portions to be connected to the bumps, and an under bump metal (UBM) connected to the RDL to increase a binding force with the solder bump.

Designing a redistribution layer (RDL) is an important process in manufacturing a semiconductor package. Since the implementation of the RDL is performed in a very small area, patterning becomes complicated and a great deal of time is required in designing the RDL.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device with fine pitch redistribution layers, substantially as shown in and/or described in connection with at least one of the figures, as set forth more completely in the claims.

Various advantages, aspects and novel features of the present disclosure, as well as details of various illustrated example supporting embodiments, will be more fully understood from the following description and drawings.

BRIEF DESCRIPTION OF SEVERAL VIEWS OF THE DRAWINGS

FIG. 1 is a plan view of a semiconductor device according to an embodiment of the present disclosure.

FIGS. 8A and 8B are plan views illustrating configurations of under bump metal layers in the semiconductor device according to still another embodiment of the present disclosure.

DETAILED DESCRIPTION

Certain aspects of the disclosure may be found in a semiconductor device with fine pitch redistribution layers. Example aspects of the disclosure may comprise covering a semiconductor die and a portion of a bond pad with a first passivation layer, the first passivation layer comprising an opening above the bond pad. A redistribution layer (RDL) may be formed on the first passivation layer with one end of the RDL electrically coupled to the bond pad and a second end comprising a connection region, and a second passivation layer may be formed on the RDL and a portion of the first passivation layer with an opening in the second passivation layer for the connection region of the RDL. An under bump metal (UBM) may be formed on the connection region of the RDL and on a portion of the second passivation layer. A bump contact may be formed on the UBM, where a width of the RDL is less than a width of the opening in the second passivation layer and is constant from the bond pad through at least a portion of the opening. The bump contact may comprise a copper pillar. The bump contact may comprise a solder cap on the copper pillar. The connection region may comprise a region of the RDL that is in contact with the UBM. The connection region may be centered beneath the bump contact. A seed layer may be under the UBM and on the connection region of the RDL and a portion of the second passivation layer. The RDL may extend to a center of the opening. A third passivation layer may be formed between the first passivation layer and the RDL. A width of the RDL may be 10 microns or less and the UBM may comprise a 25 micron×45 micron oval or less. A width of the RDL may be 10 microns or less and the UBM may comprise a 25 micron or less circle.

Figure 2A:
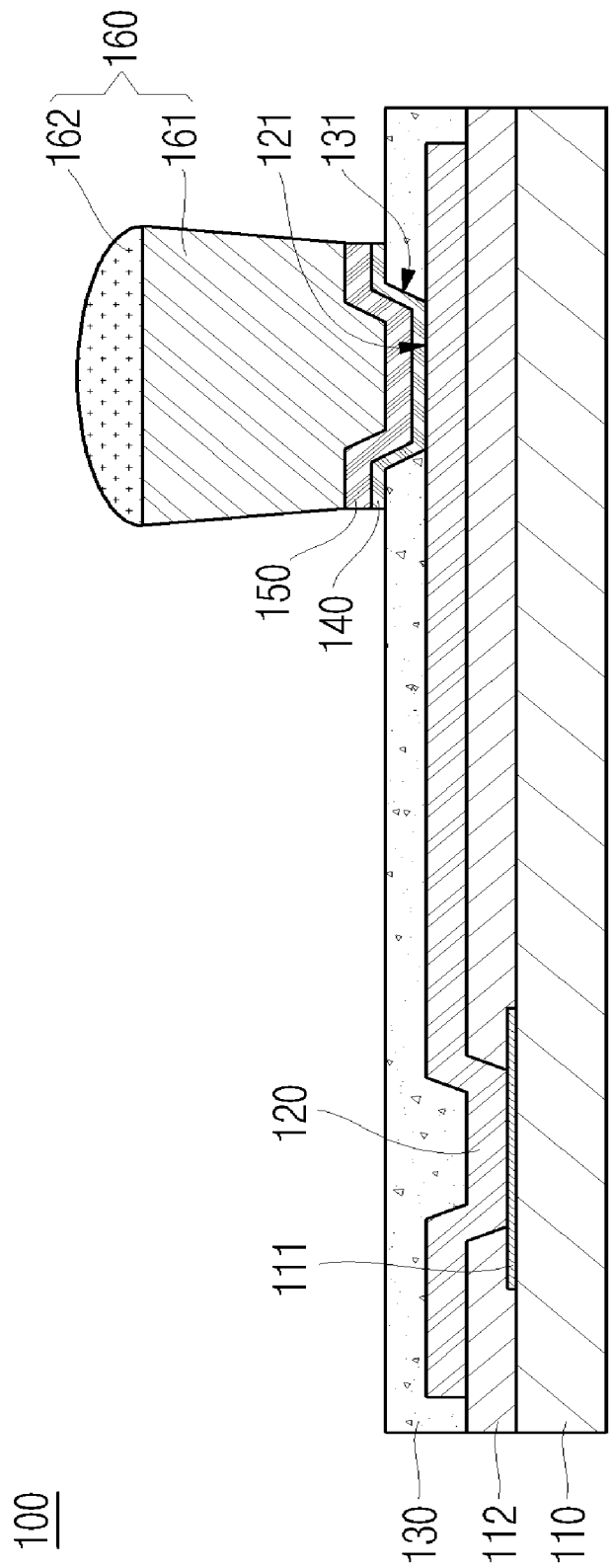
FIGS. 2A and 2B are cross-sectional views of the semiconductor device according to an embodiment of the present disclosure, taken along lines A-A' and B-B' of FIG. 1.
Figure 2B:
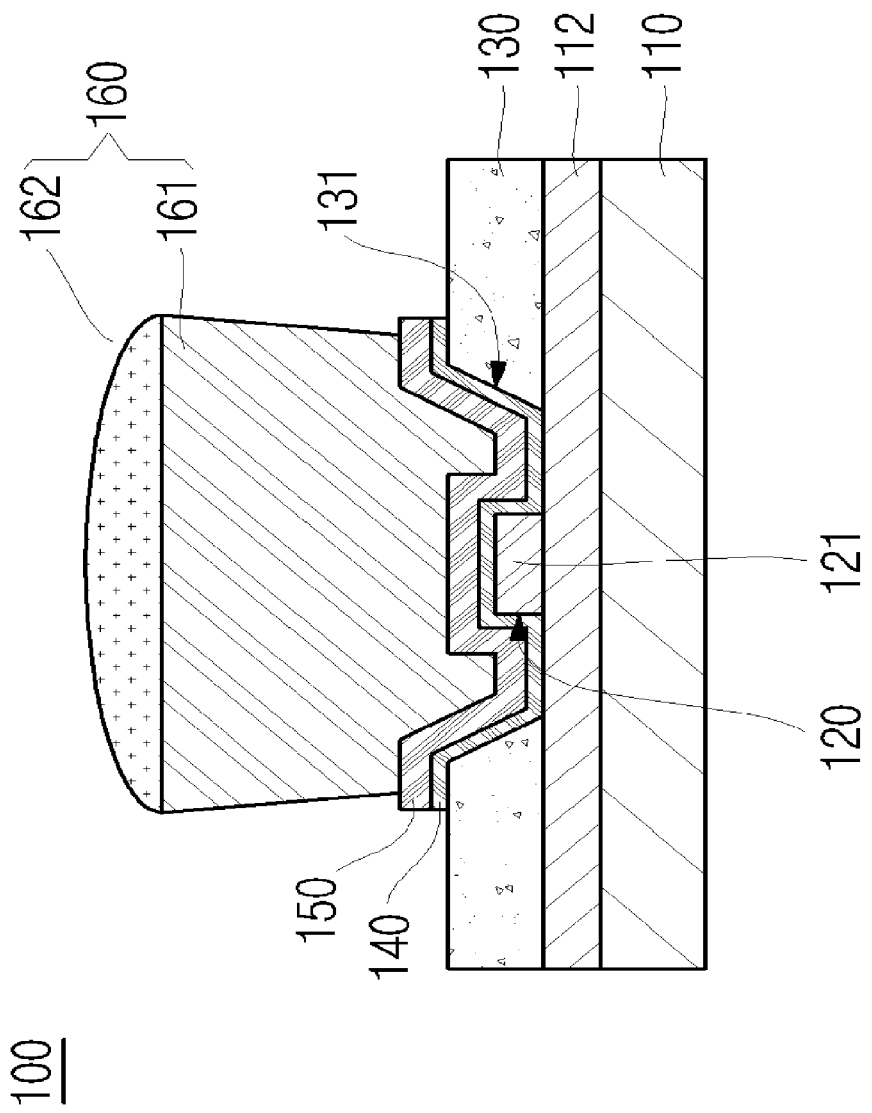
Figure 3:
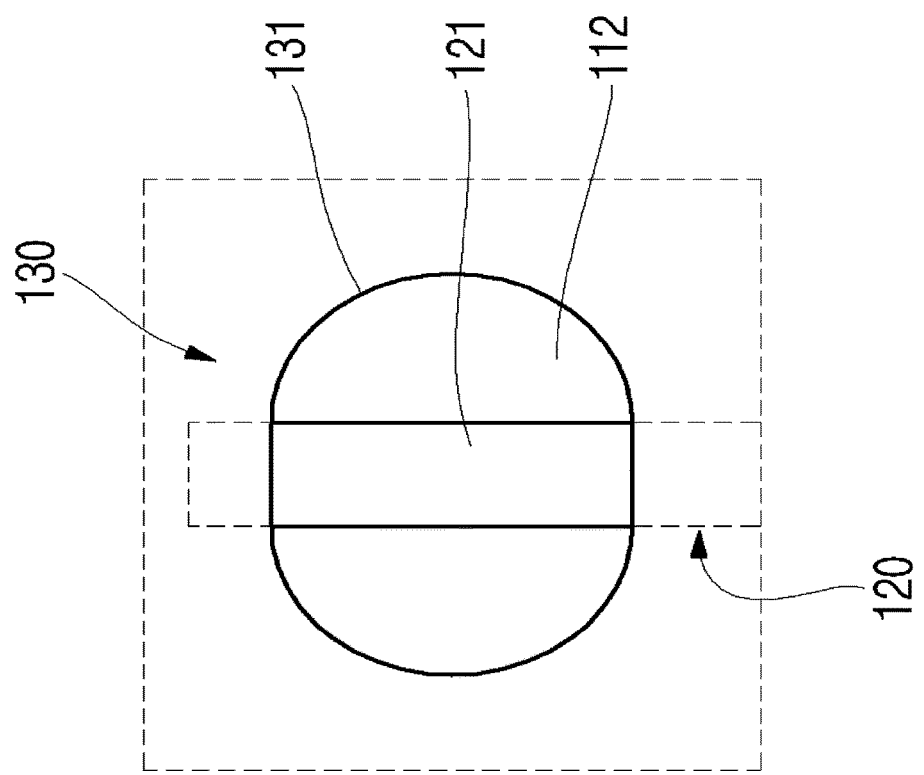
FIG. 3 is an enlarged plan view of a portion 'C' of FIG. 1, in the semiconductor device according to an embodiment of the present disclosure.

FIG. 1 is a plan view of a semiconductor device according to an embodiment of the present disclosure, FIGS. 2A and 2B are cross-sectional views of the semiconductor device according to an embodiment of the present disclosure, taken along lines A-A' and B-B' of FIG. 1, and FIG. 3 is an enlarged plan view of a portion 'C' of FIG. 1, in the semiconductor device according to an embodiment of the present disclosure. For brevity, only a redistribution layer and an under bump metal (UBM) are illustrated in FIG. 1 and only a die passivation layer, a redistribution layer and a passivation layer are illustrated in FIG. 3.

As illustrated in FIGS. 1 to 3, the semiconductor device 100 according to an embodiment of the present disclosure includes a semiconductor die 110 having a plurality of bond pads 111 formed thereon, a redistribution layer (RDL) 120 electrically connected to the bond pads 111, a passivation layer 130 exposing a portion of the RDL 120, an UBM 150 electrically connected to the RDL 120, and a bump 160 connected to the UBM 150.

The semiconductor die 110 may comprise a silicon material and has a plurality of semiconductor devices formed therein. The bond pads 111 and a die passivation layer 112 may be formed on the semiconductor die 110. The bond pads 111 may comprise metal layers through which electrical signals are input to/output from the semiconductor die 110 and include a plurality of bond pads formed on a top surface of the semiconductor die 110. The die passivation layer 112 may be formed on the top surface of the semiconductor die 110 and may cover a portion of a region of the semiconductor die 110, where the bond pads 111 are formed. The bond pads 111 may be partially exposed by the die passivation layer 112 to then be electrically connected to the RDL 120.

The die passivation layer 112 protects the semiconductor die 110 against external shocks and insulates regions other than the bond pads 111. The bond pads 111 may comprise one or more of: copper, aluminum and similar materials, for example. In addition, the die passivation layer 112 may comprise one or more of an inorganic layer, such as a nitride layer (Si3N4), an oxide layer (SiO2) and similar materials, for example. However, embodiments of the present disclosure are not limited to the materials of the bond pads 111 and the die passivation layer 112 listed herein.

The RDL 120 may comprise one end electrically connected to the bond pad 111 of the semiconductor die 110 and the other end electrically connected to the UBM 150. The RDL 120 includes a connection region 121 exposed by the passivation layer 130 and electrically connected to the UBM 150. The connection region 121 may be positioned at the center of the other end of the RDL 120. The RDL 120 may be formed to extend from the one end of each of the bond pads 111 longer than (or past) a region corresponding to the UBM 150. The RDL 120 redistributes an electrical path of the semiconductor die 110. Therefore, the RDL 120 may redistribute an electrical path to be connected to the bump 160 (or other contact structure) to allow the bump 160 to match with an external circuit pattern, irrespective of the positions of the bond pads 111. The RDL 120 may comprise copper or similar material, for example.

The RDL 120 may be formed by performing electroplating using a redistribution layer seed (not shown). The redistribution layer seed may comprise a thin layer formed on the semiconductor die 110 by electroless plating, for example, thereby providing a current path, followed by performing electroplating to form the RDL 120.

The passivation layer 130 may cover the RDL 120 and may expose the connection region 121 of the RDL 120 and the die passivation layer 112 positioned in the vicinity of the connection region 121 by forming an opening 131. The opening 131 may be formed at a position corresponding to the center of the other end of the RDL 120. The UBM 150 may be formed at a region exposed to the opening 131 to be connected to the RDL 120. The passivation layer 130 may be formed of an organic layer including, for example, one of, for example, polyimide (PI), benzo cyclo butane (BCB), poly benz oxazole (PBO), bismaleimide triazine (BT), a phenolic resin, epoxy, or similar materials, but embodiments of the present disclosure are not limited to the material of the passivation layer 130 listed herein. The passivation layer 130 may be excluded in some cases.

The UBM seed layer 140 may cover the opening 131 of the passivation layer 130 and a region near the opening 131. The UBM seed layer 140 may cover both of the connection region 121 exposed by the opening 131 and the exposed passivation layer 130. Therefore, the UBM seed layer 140 is electrically connected to the RDL 120 and the bond pads 111 through the connection region 121. The UBM seed layer 140 may comprise copper or similar material, and may be formed using electroless plating. In addition, the UBM seed layer 140 provides a current path when the UBM 150 is formed.

The UBM 150 may be formed on the UBM seed layer 140. The UBM 150 may cover the connection region 121 exposed by the opening 131 and the passivation layer 130. In more detail, the UBM 150 may surround a top surface and lateral surfaces of the connection region 121. The UBM 150 facilitates a connection between the RDL 120 and the bump 160. The bond pads 111 and the bump 160 may be electrically connected by the UBM 150. The UBM 150 is shown as a single layer, but may include a plurality of layers. The UBM 150 may be formed by electroplating where the UBM 150 may be formed by applying a current to the UBM seed layer 140 as a seed. The UBM 150 may comprise chrome/chrome-copper alloy/copper (Cr/Cr—Cu/Cu), titanium-tungsten alloy/copper (Ti—W/Cu), aluminum/nickel/copper (Al/Ni/Cu), or similar materials.

The bump 160 may be connected to the UBM 150. The bump 160 may provide a path through which the semiconductor die 110 is electrically connected to an external circuit. The bump 160 may include a conductive pillar 161 and a solder cap 162. The conductive pillar 161 may comprises copper or similar material, and the solder cap 162 may comprise tin/lead (Sn/Pb), leadless Sn, or similar materials, but is not limited thereto.

Referring to FIG. 3, the RDL 120 may be formed to have a uniform width. Accordingly, the RDL 120 may be formed to have the same width with a region other than the connection region 121 of the RDL 120 even in the connection region 121 connected to the UBM 150. In other words, since a pad of the RDL 120 having a relatively wide area to be connected to the UBM 150 is not provided, the manufacturing process of the semiconductor device 100 can be simplified. In addition, when designing the path of another RDL, a spatial limitation due to presence of the connection region 121 adjacent thereto may be mitigated. Therefore, when another RDL is designed, a space for designing another RDL can be easily configured, thereby minimizing an electric short between the connection region 121 and another RDL adjacent to the connection region 121 while increasing the degree of freedom in designing the RDL.

In addition, the UBM 150 is formed to cover the opening 131 of the passivation layer 130 and a region positioned in the vicinity of the opening 131. The UBM 150 may be formed to have a larger area than the connection region 121 of the RDL 120. In an example scenario, an area of the opening 131 is larger than an area of the connection region 121. Therefore, even if the connection region 121 of the RDL 120 has a relatively small area, the UBM 150 has a larger area than the connection region 121, thereby allowing the UBM 150 to be easily connected to the bump 160.

A portion of the UBM 150 in the opening 131 may be formed on the die passivation layer 112 exposed by the passivation layer 130. However, since the UBM 150 may be formed by electroplating using the UBM seed layer 140 as a seed, it may be easily formed on the die passivation layer 112.

As described above, in the semiconductor device 100 according to an embodiment of the present disclosure, since a pad of the RDL 120 to be connected to the UBM 150 is not required, the manufacturing process of the semiconductor device 100 may be simplified and space for the RDL 120 may be easily secured in designing the RDL 120.

Figure 4:
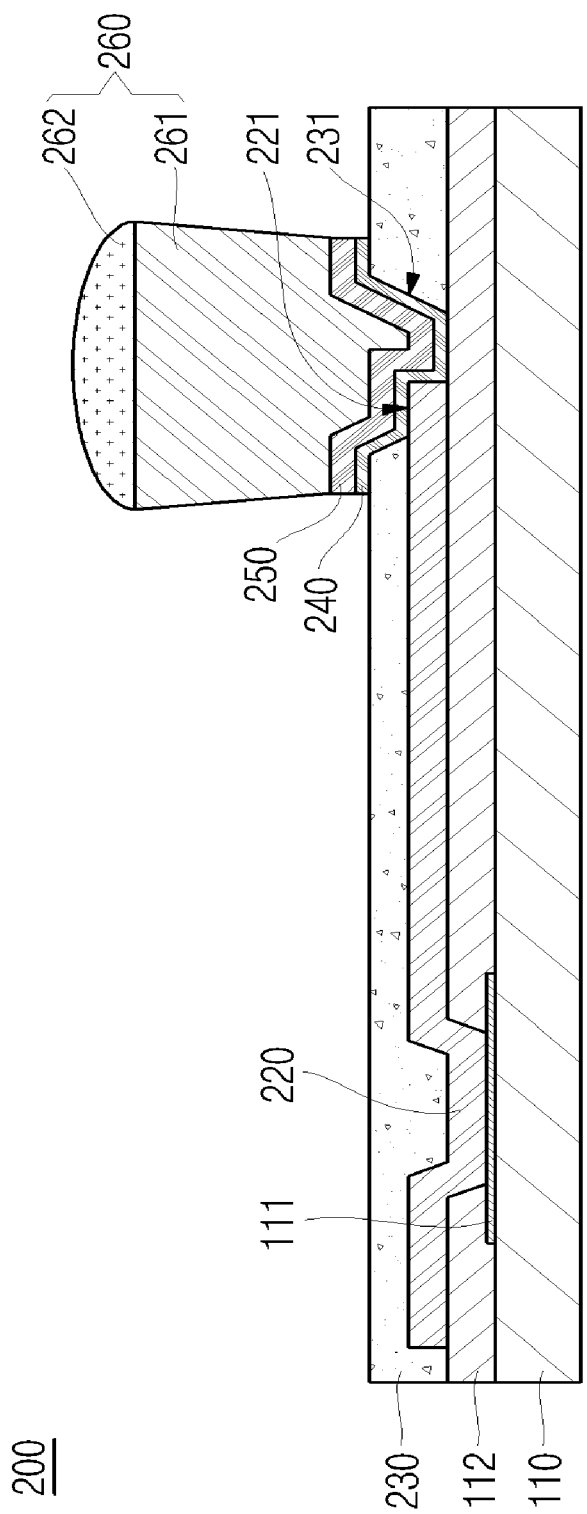
FIG. 4 is a cross-sectional view of the semiconductor device according to another embodiment of the present disclosure, taken along the line A-A' of FIG. 1.
Figure 5:
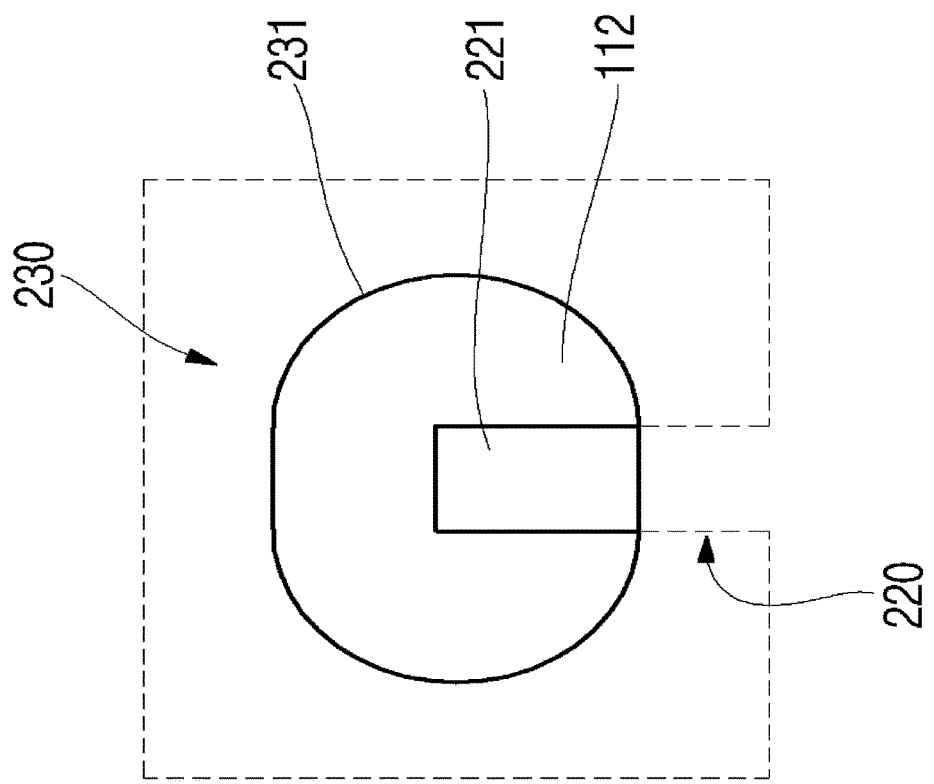
FIG. 5 is an enlarged plan view of a portion 'C' of FIG. 1, in the semiconductor device according to another embodiment of the present disclosure.

FIG. 4 is a cross-sectional view of the semiconductor device according to another embodiment of the present disclosure, taken along the line A-A' of FIG. 1 and FIG. 5 is an enlarged plan view of a portion 'C' of FIG. 1, in the semiconductor device according to another embodiment of the present disclosure. For brevity, the component having the same function as that of the previous embodiment is referred to as the same reference numeral, and the following description will focus on differences between the previous and present embodiments.

Referring to FIGS. 4 and 5, the semiconductor device 200 according to another embodiment of the present disclosure includes a semiconductor die 110, a redistribution layer (RDL) 220, a passivation layer 230, an UBM seed layer 240, a UBM 250, and a bump 260. Although not shown, a cross-sectional view of a portion of the semiconductor device 200 according to another embodiment of the present disclosure, corresponding to the line B-B' of FIG. 1, may be similar to the cross-sectional view shown in FIG. 2B.

The RDL 220 has one end electrically connected to a bond pad 111 of the semiconductor die 110 and the other end electrically connected to the UBM 250. The RDL 220 may comprise a connection region 221 exposed by the passivation layer 230 to be electrically connected to the UBM 250. The connection region 221 may be positioned at an end of the RDL 220 such that the RDL 220 may be formed to extend from the one end connected to the bond pad 111 to a region corresponding to the UBM 250.

The passivation layer 230 may be formed to cover the RDL 220. An opening 231 may be formed in a region of the passivation layer 230 to expose the connection region 221 of the RDL 220 and the die passivation layer 112 positioned in vicinity of the connection region 221. Here, the opening 231 may be formed at a position corresponding to the end of the other end of the RDL 220. Meanwhile, the passivation layer 230 may be excluded in some cases.

The UBM seed layer 240 covers the opening 231 of the passivation layer 230 and a region surrounding the opening 231. In more detail, the UBM seed layer 240 covers the connection region 221 exposed by the opening 231 and the die passivation layer 112. Therefore, the UBM seed layer 240 is electrically connected to the RDL 220 and the bond pad 111 through the connection region 221.

The UBM 250 may be formed on the UBM seed layer 240. The UBM 250 covers the connection region 221 exposed by the opening 231 and the die passivation layer 112. The UBM 250 facilitates a connection between the RDL 220 and the bump 260.

The bump 260 may be connected to the UBM 250. The bump 260 may comprise a conductive pillar 261 and a solder cap 262.

Referring to FIG. 5, the connection region 221 may be positioned at an end of the RDL 220 and the opening 231 may expose the connection region 221 positioned at the end of the RDL 220. In other words, unlike in the previous embodiment in which the RDL 120 is formed to extend from one end connected to the bond pad 111 to or past where the UBM 250 is formed, the RDL 220 may be formed to extend to only a region corresponding to the UBM 250 (e.g., ending at or within the footprint of the UBM 250). Therefore, a space can be easily secured by forming the RDL 220 having a reduced length when another RDL is formed in the vicinity of the RDL 220. For example, as shown in FIG. 4, the UBM seed layer 240 and the UBM 250 may cover from one to three vertical side surfaces of the connection region 221 of the RDL 220, including for example two side vertical surfaces and an end vertical surface.

The RDL 220 may comprise a uniform width along its length, such that the RDL 220 in the connection region 221 and in other regions, excluding the connection region 221, may have the same width. Therefore, since the area of the connection region 221 where the UBM 250 is formed is not large, a space limitation, which may arise when forming another RDL disposed to pass by the connection region 221, may be mitigated. Accordingly, since it is easy to secure a space in designing the RDL 220, an electric short between the connection region 221 and another RDL adjacent to the connection region 221 can be minimized while increasing the degree of design freedom.

In addition, the UBM 250 may be formed to have a larger area than the connection region 221. Therefore, even in a case where the connection region 221 has a relatively small area, since the UBM 250 has a larger area than the connection region 221, a connection between the UBM 250 and the bump 260 can be facilitated.

Figure 6A:
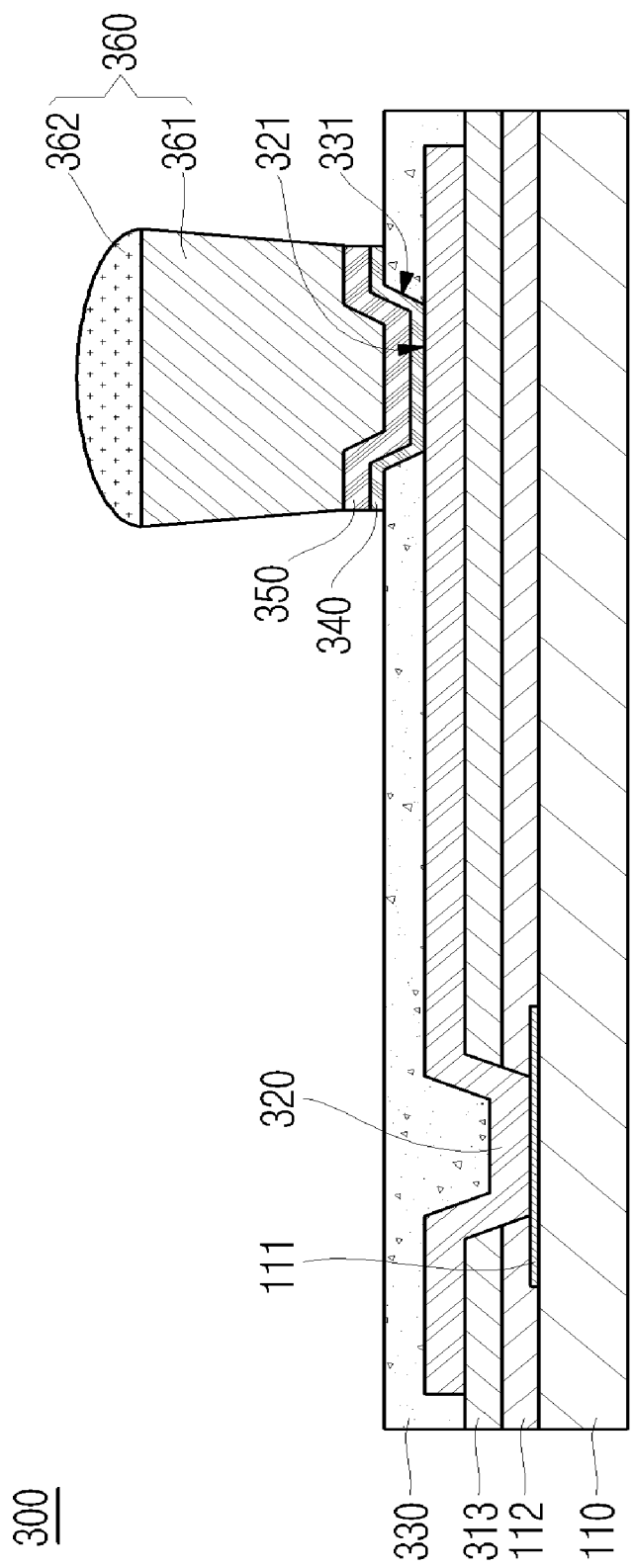
FIGS. 6A and 6B are cross-sectional views of the semiconductor device according to still another embodiment of the present disclosure, taken along lines A-A' and B-B' of FIG. 1.
Figure 6B:
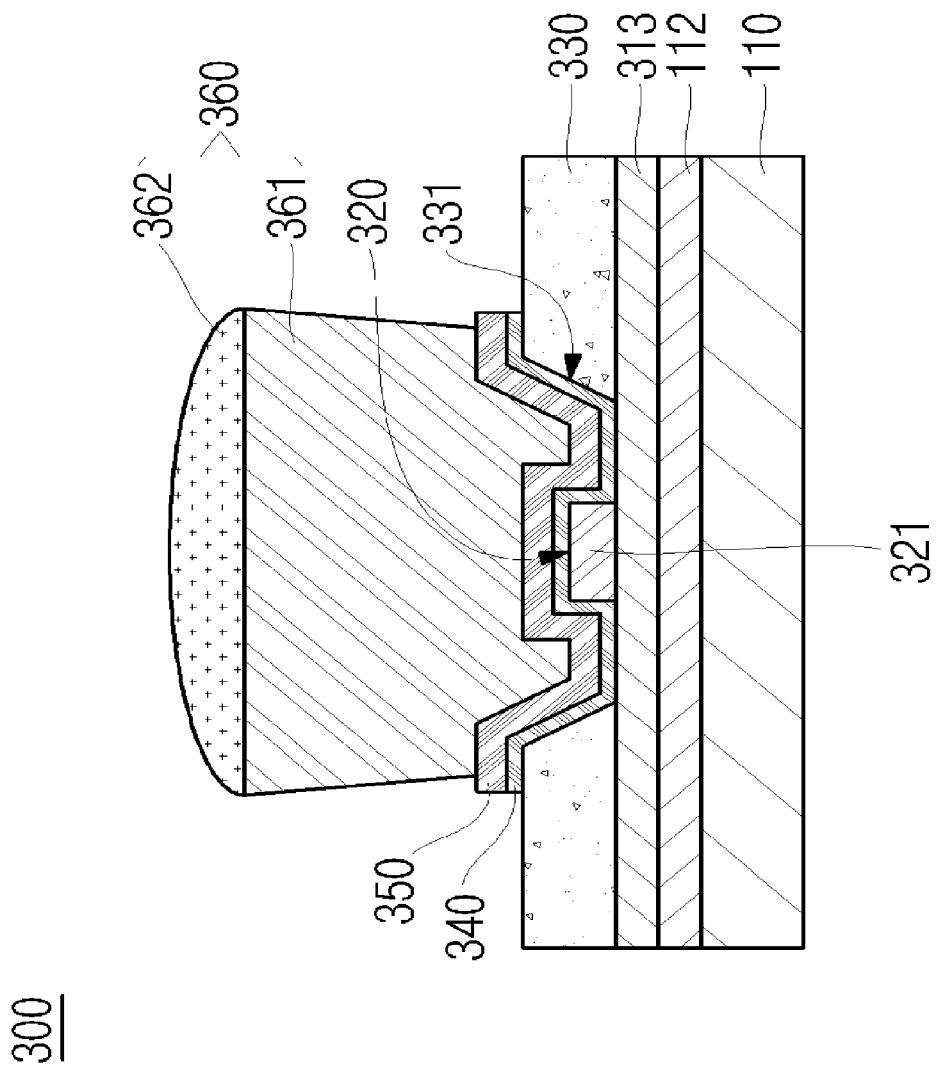

FIGS. 6A and 6B are cross-sectional views of the semiconductor device according to still another embodiment of the present disclosure, taken along lines A-A' and B-B' of FIG. 1. For brevity, the component having the same function as that of the previous embodiment is referred to as the same reference numeral, and the following description will focus on differences between the previous and present embodiments.

Referring to FIGS. 6A and 6B, the semiconductor device 300 according to still another embodiment of the present disclosure comprises a semiconductor die 110, a first passivation layer 313, a RDL 320, a second passivation layer 330, a UBM seed layer 340, a UBM 350 and a bump 360. Although not shown, an enlarged plan view of a portion of the semiconductor device 300 according to still another embodiment of the present disclosure, corresponding to the portion C of FIG. 1, may be similar to the enlarged plan view shown in FIG. 3.

The first passivation layer 313 may be formed on the semiconductor die 110. In addition, the first passivation layer 313 may be formed to expose the bond pad 111. The first passivation layer 313 may allow the semiconductor die 110 to be electrically insulated in a region other than the bond pad 111. The first passivation layer 313 may comprise an organic layer, for example, comprising one or more of: polyimide (PI), benzo cyclo butane (BCB), poly benz oxazole (PBO), bismaleimidetriazine (BT), phenolic resin, and epoxy, for example, but is not limited thereto. In the semiconductor device 300 according to still another embodiment of the present disclosure, the first passivation layer 313 comprising an organic layer is further formed on the semiconductor die 110, thereby easily absorbing external shock applied to the semiconductor device 300.

The RDL 320 may be formed on the first passivation layer 313. The RDL 320 may have one end electrically connected to the bond pad 111 of the semiconductor die 110 and the other end electrically connected to the UBM 350. The RDL 320 comprises a connection region 321 exposed by the second passivation layer 330 to be electrically connected to the UBM 350. The connection region 321 may be positioned at the center of the end of the RDL 320 opposite the bond pad 111, thereby extending from the bond pad 111 and beyond the UBM 350.

The second passivation layer 330 may be formed to cover the RDL 320. The second passivation layer 330 may comprise an opening 331 to expose the connection region 321 of the RDL 320 and the first passivation layer 313 near the connection region 321. The opening 331 may be formed at a position corresponding to the center of the other end of the RDL 320. The second passivation layer 330 may comprise the same material as the first passivation layer 313. In addition, the second passivation layer 330 may be excluded in some cases.

The UBM seed layer 340 may cover the opening 331 of the second passivation layer 330 and a region surrounding the opening 331. In more detail, the UBM seed layer 340 may cover the connection region 321 exposed by the opening 331 and the first passivation layer 313. Therefore, the UBM seed layer 340 may be electrically connected to the RDL 320 and the bond pad 311 through the connection region 321.

The UBM 350 may be formed on the UBM seed layer 340. The UBM 350 covers the connection region 321 exposed by the opening 331 and the first passivation layer 313. The UBM 350 facilitates a connection between the RDL 320 and the bump 360.

The bump 360 may be connected to the UBM 350. The bump 360 may, for example, comprise a conductive pillar 361 and a solder cap 362, or any of a variety of contact structures.

The RDL 320 may have a uniform width i.e., the RDL 320 in the connection region 321 and the RDL 320 in any other region other than the connection region 321 have the same width. Therefore, since an area of the connection region 321 where the UBM 350 is formed is not large, a space limitation, which may arise in a case of forming another RDL formed nearby the connection region 321, may be mitigated. Accordingly, since it may be easier to secure a space in designing the RDL 320, an electric short between the connection region 321 and another RDL adjacent to the connection region 321 may be minimized while increasing the degree of design freedom.

In addition, the UBM 350 may be formed to have a larger area than the connection region 321. Therefore, even in a case where the connection region 321 has a relatively small area, since the UBM 350 has a larger area than the connection region 221, a connection between the UBM 350 and the bump 360 can be facilitated.

Figure 7:
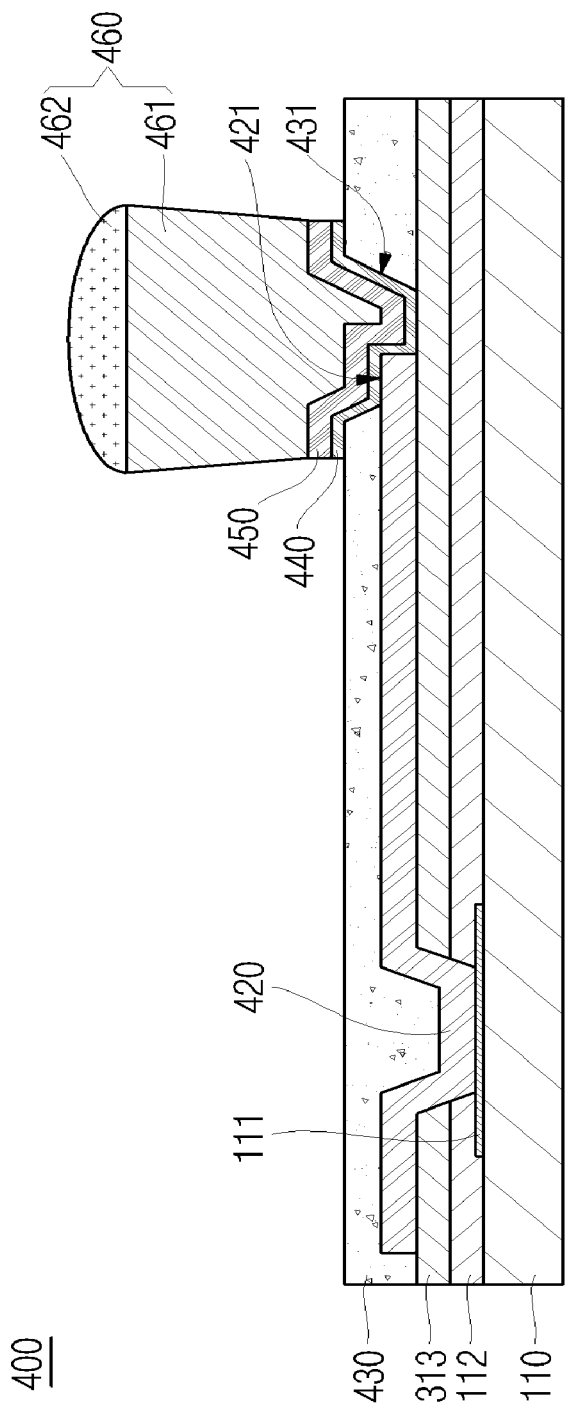
FIG. 7 is a cross-sectional view of the semiconductor device according to still another embodiment of the present disclosure, taken along the line A-A' of FIG. 1.

FIG. 7 is a cross-sectional view of the semiconductor device according to still another embodiment of the present disclosure, taken along the line A-A' of FIG. 1. For brevity, the component having the same function as that of the previous embodiment is referred to as the same reference numeral, and the following description will focus on differences between the previous and present embodiments.

Referring to FIG. 7, the semiconductor device 400 according to still another embodiment of the present disclosure includes a semiconductor die 110, a first passivation layer 313, a redistribution layer (RDL) 420, a second passivation layer 430, a UBM seed layer 440, a UBM 450 and a bump 460. Although not shown, a cross-sectional view of a portion of the semiconductor device 400 according to still another embodiment of the present disclosure, corresponding to the line B-B' of FIG. 1, may be similar to the cross-sectional view shown in FIG. 6B, and an enlarged plan view of a portion of the semiconductor device 400, corresponding to the portion C of FIG. 1, may be similar to the enlarged plan view shown in FIG. 5.

The RDL 420 may be formed on the first passivation layer 313. The RDL 420 may have one end electrically connected to the bond pad 111 of the semiconductor die 110 and the other end electrically connected to the UBM 450. The RDL 420 may comprise a connection region 421 exposed by the passivation layer 430 and electrically connected to the UBM 450. Here, the connection region 421 may be positioned at an end of RDL 420 where the RDL 420 may be formed to extend from the bond pad 111 to a region corresponding to the UBM 450 (e.g., extending to the edge or within the footprint of the UBM 450, rather than past the UBM 450 as shown in the example of FIG. 6).

The second passivation layer 430 may be formed to cover the RDL 420. The second passivation layer 430 may comprise an opening 431 formed to expose the connection region 421 of the RDL 420 and the first passivation layer 313 disposed in the vicinity of the connection region 421. The opening 431 may be formed at a position corresponding to the end of the RDL 420 opposite to the bond pad 111. The second passivation layer 430 may be excluded in some cases.

The UBM seed layer 440 may cover the opening 431 of the second passivation layer 430 and a region surrounding the opening 431. In more detail, the UBM seed layer 440 may cover the connection region 421 exposed by the opening 431 and the first passivation layer 413. Therefore, the UBM seed layer 440 may be electrically connected to the RDL 420 and the bond pad 411 through the connection region 421.

The UBM 450 may be formed on the UBM seed layer 440. The UBM 450 covers the connection region 421 exposed by the opening 431 and the first passivation layer 313 and may facilitate a connection between the RDL 420 and the bump 460.

The bump 460 may be connected to the UBM 450 and may comprise a conductive pillar 461 and a solder cap 462.

The connection region 421 may be positioned at an end of the RDL 420 and the opening 431 may expose the connection region 421 positioned at the end of the RDL 420. In other words, the RDL 420 may be formed to extend from the bond pad 111 to a region corresponding to the UBM 450. Therefore, space on the die can be easily secured by forming the RDL 420 having a reduced length when another RDL is formed in vicinity of the RDL 420, thereby further increasing chip layout design freedom.

The RDL 420 may comprise a uniform width in that the RDL 420 may have a constant width in the connection region 421 as well as in any other region along its length. Therefore, since an area of the connection region 421 where the UBM 450 is formed is not large, a space limitation that may arise when forming another RDL near the connection region 421 may be mitigated. Since it is easy to secure chip space in designing the RDL 420, an electric short between the connection region 421 and another RDL adjacent to the connection region 421 may be minimized while increasing the degree of design freedom.

In addition, the UBM 450 may be formed to have a larger area than the connection region 421. Therefore, even when the connection region 421 has a relatively small area, since the UBM 450 has a larger area than the connection region 421, a connection between the UBM 450 and the bump 460 can be facilitated.

FIGS. 8A and 8B are plan views illustrating configurations of UBMs in the semiconductor device according to still another embodiment of the present disclosure.

Referring to FIGS. 8A and 8B, the semiconductor device according to still another embodiment of the present disclosure comprises a plurality of redistribution layers (RDLs) 520 and UBMs 550a and 550b electrically connected to the RDLs 520. For brevity, the component having the same function as that of the previous embodiment is referred to as the same reference numeral, and repeated descriptions thereof will not be given.

The RDLs 520 may be arranged to pass by in regions adjacent to each other. In addition, UBMs 550a and 550b may be formed on the RDLs 520. In the illustrated embodiment, the UBMs 550a and 550b are centrally formed in the RDLs 520, but aspects of the present disclosure are not limited thereto. The UBMs 550a and 550b may be formed at various spots according to the circumstances.

The RDLs 520 have a uniform width in the connection region, where UBMs 550a and 550b are formed, and/or in other regions as well. Note, however, that the width need not be uniform. Therefore, since an area of the connection region is not large, it is easy to secure a space in designing another RDL disposed to pass by in close proximity to the connection region. Accordingly, an electric short between the connection region and another RDL can be minimized while increasing the degree of design freedom.

The UBMs 550a and 550b may be formed to have larger areas than the RDLs 520. Therefore, even in a case where the connection region has a relatively small area, since the UBMs 550a and 550b have larger areas than the connection region, connections between the UBMs 550a and 550b and bumps can be facilitated. In an example scenario, the RDLs 520 of FIG. 8A may have a 10 micron width with a 50 micron pitch or less, while the UBMs may comprise a 25 micron×45 micron or less oval.

As shown in FIG. 8A, the UBM 550a may be formed to have an elliptical shape. In addition, as shown in FIG. 8B, the UBM 550b may be formed to have a circular shape. However, the shapes of the UBMs 550a and 550b may vary according to circumstances. In another example scenario, the RDLs 520 of FIG. 8B may have a 10 micron width with a 55 micron pitch or less, while the UBMs may comprise a 25 micron diameter or less circle. These example dimensions therefore allow an RDL to pass between UBMs, as shown in FIGS. 8A and 8B.

Figure 9:
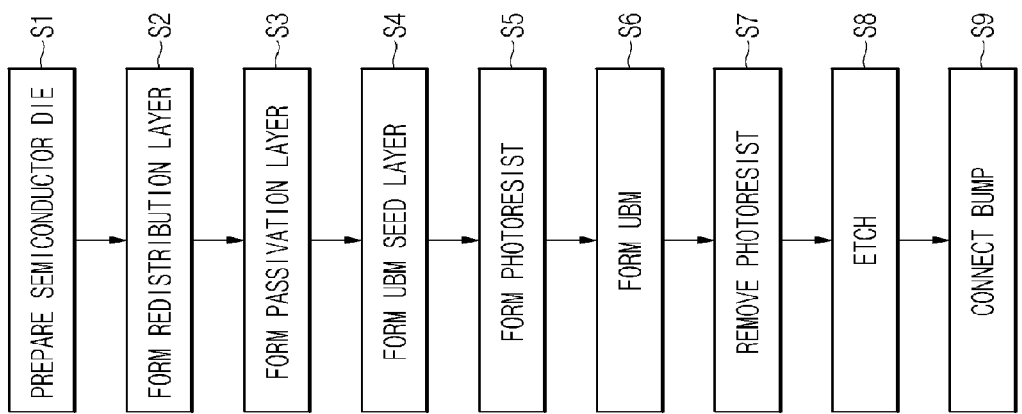
FIG. 9 is a flowchart illustrating a manufacturing method of a semiconductor device according to an embodiment of the present disclosure.

FIG. 9 is a flowchart illustrating a manufacturing method of a semiconductor device according to an embodiment of the present disclosure, and FIGS. 10A to 10I are cross-sectional views sequentially illustrating a manufacturing method of a semiconductor device according to an embodiment of the present disclosure.

Figures 10A, 10B:
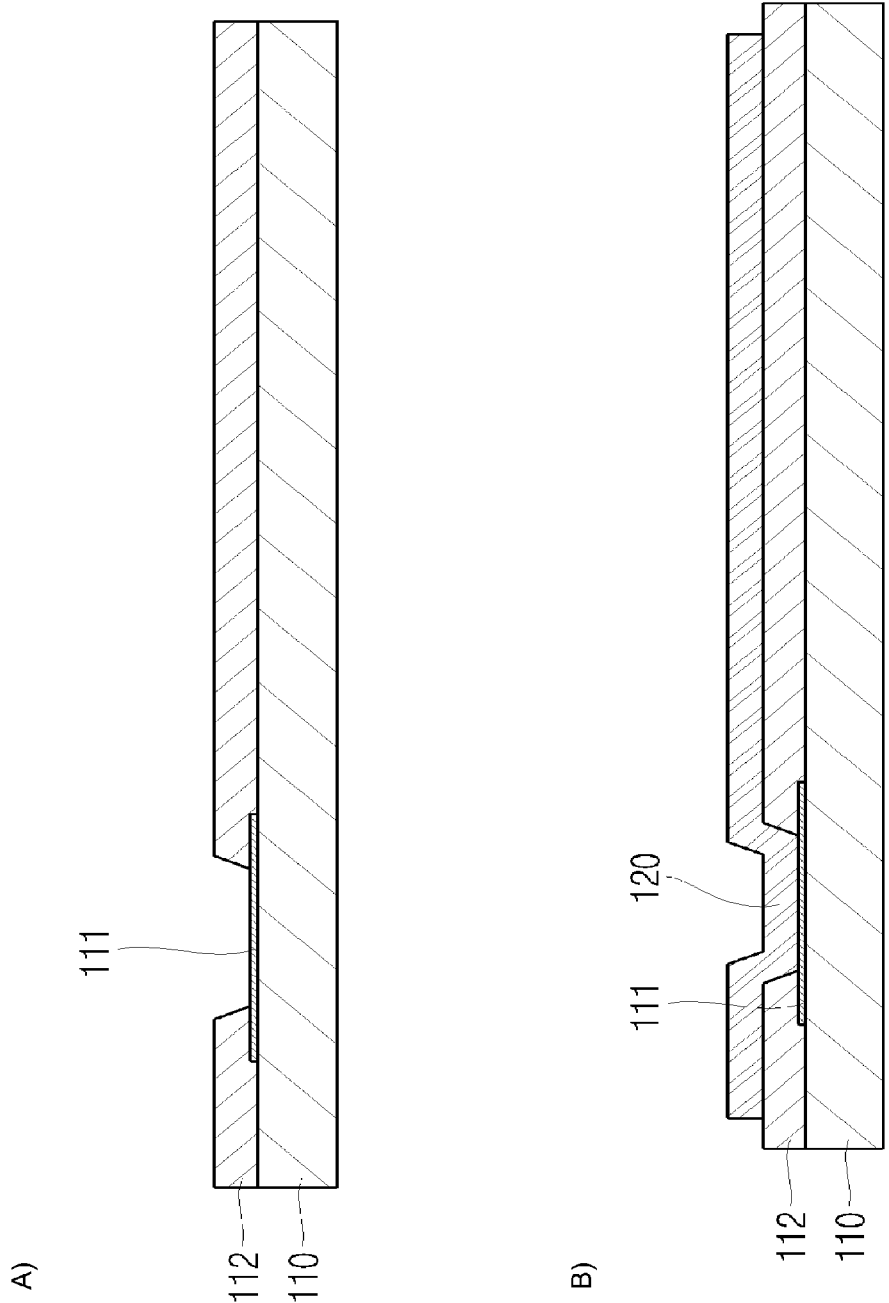
FIGS. 10A to 10I are cross-sectional views sequentially illustrating a manufacturing method of a semiconductor device according to an embodiment of the present disclosure.
Figure 10C:
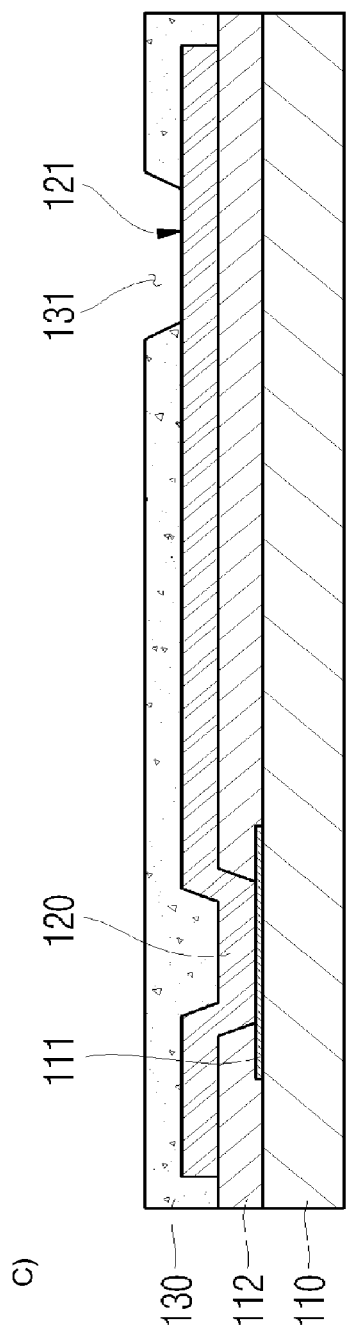
Figure 10D:
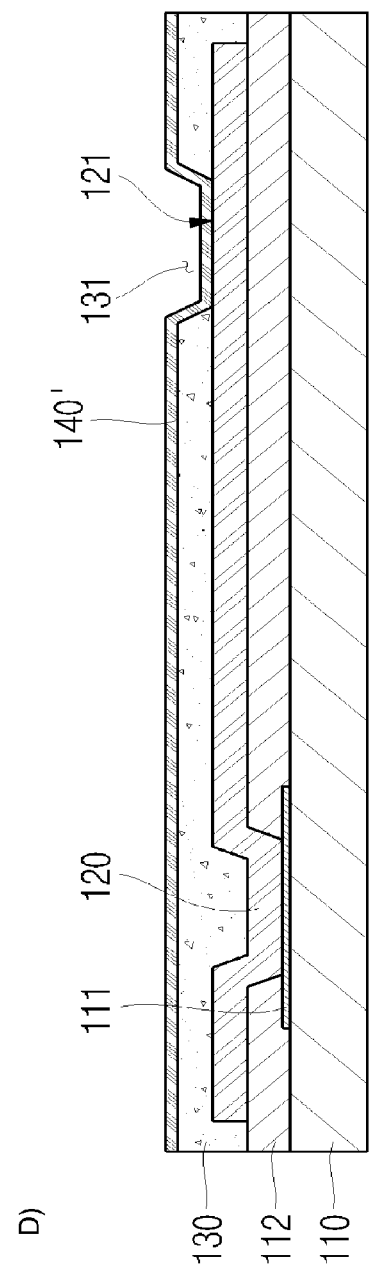
Figure 10E:
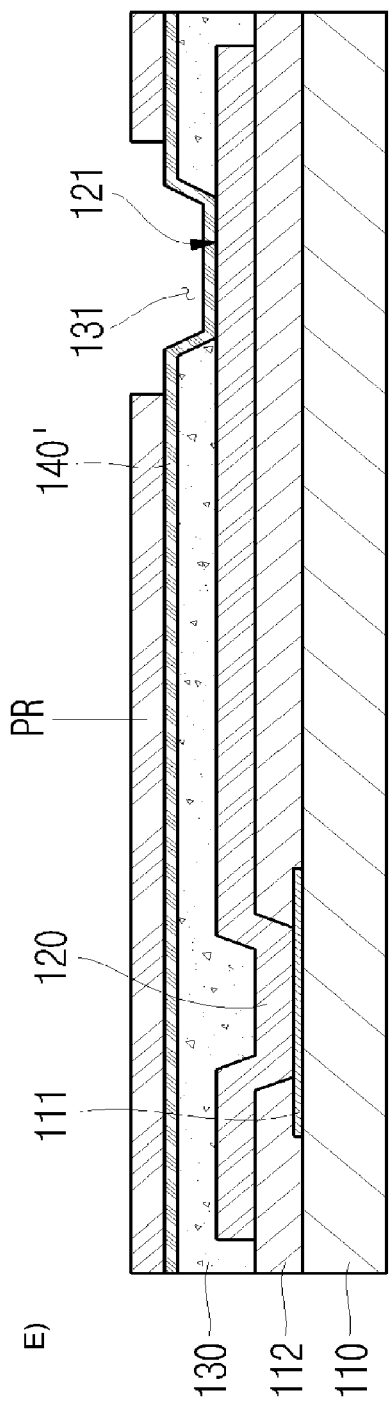
Figure 10F:
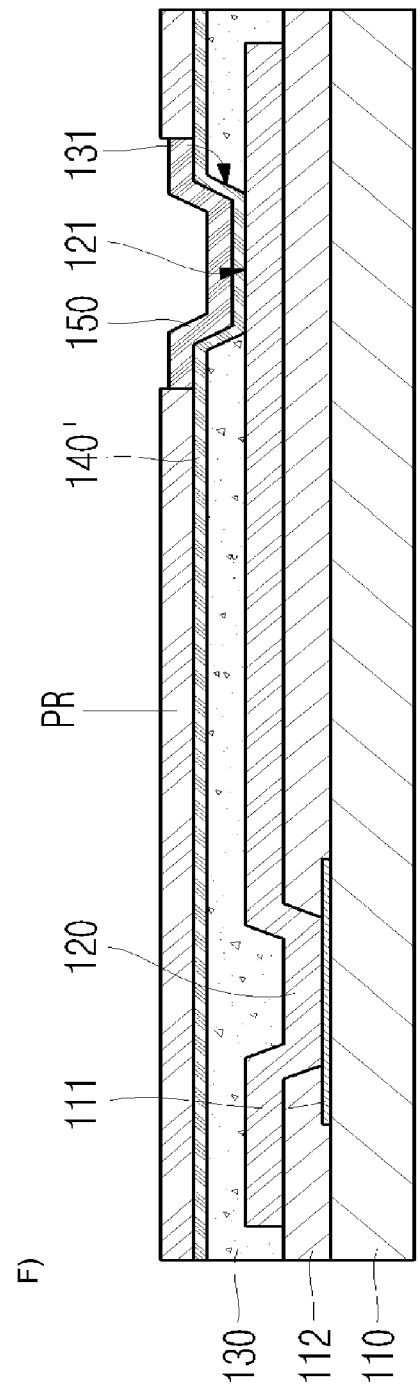
Figure 10G:
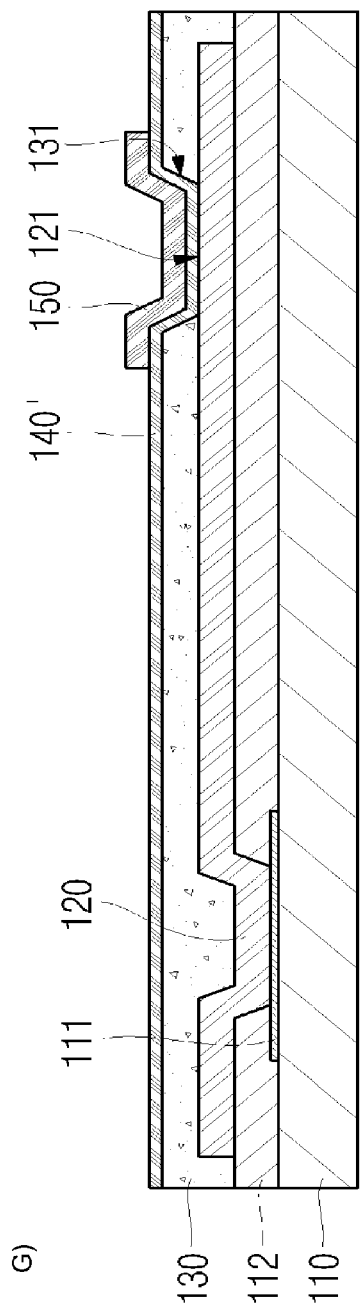
Figure 10H:
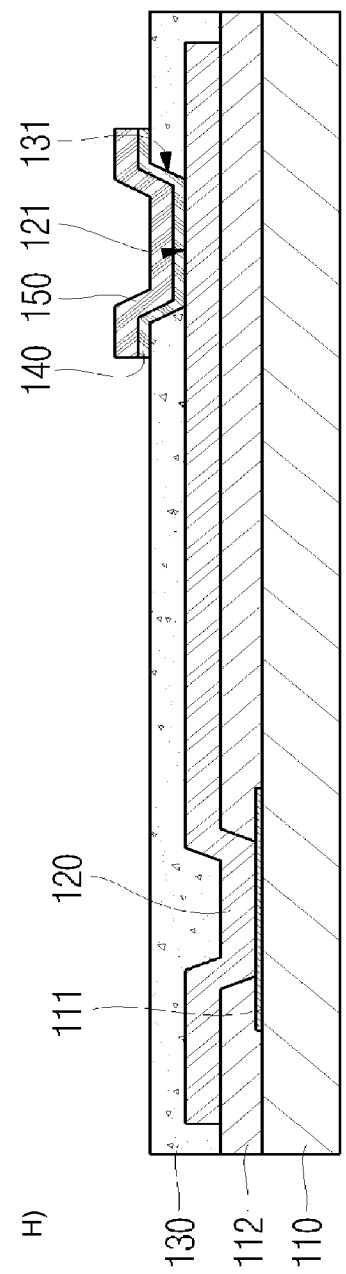
Figure 10I:
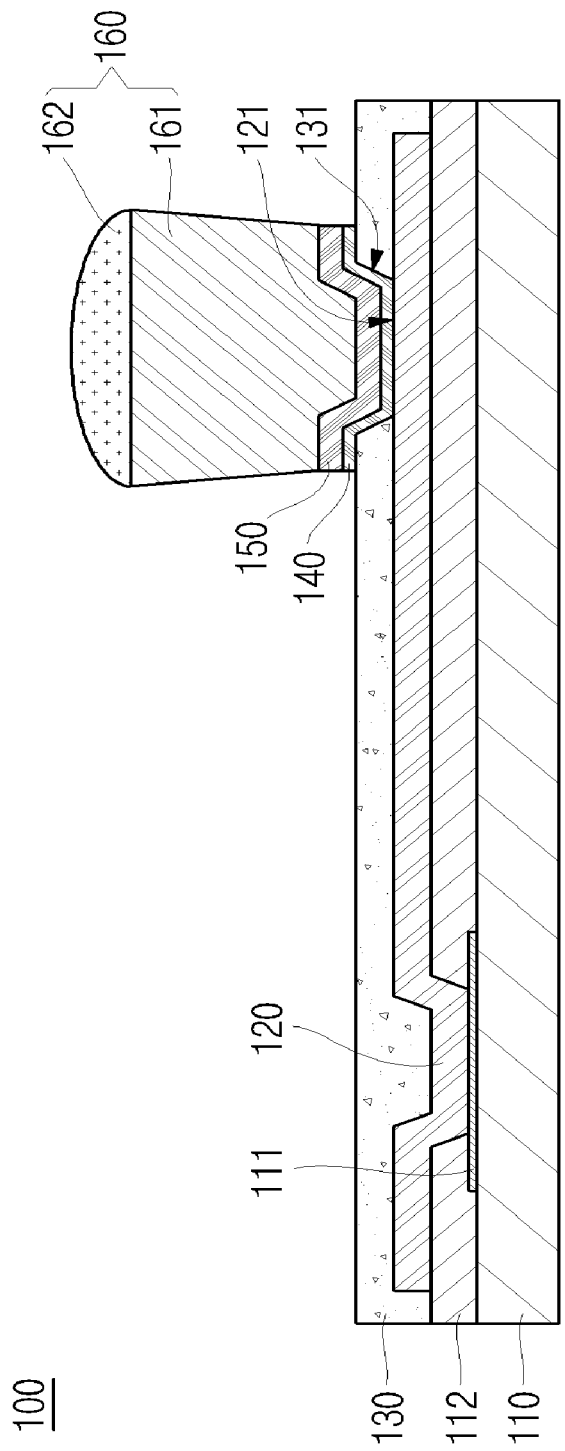

Referring to FIGS. 9 to 10I, the manufacturing method of the semiconductor device according to an embodiment of the present disclosure may comprise preparing a semiconductor die (S1), forming a redistribution layer (RDL) (S2), forming a passivation layer (S3), forming a UBM seed layer (S4), forming a photoresist (S5), forming a UBM (S6), removing the photoresist (S7), etching (S8), and connecting a bump (S9). Also, although not shown, the manufacturing method of the semiconductor device according to this embodiment may also be applied to the semiconductor devices 200, 300, 400 according to other embodiments of the present disclosure.

Referring to FIGS. 9 and 10A, in step S1, the semiconductor die 110 including a plurality of bond pads 111 is provided. The plurality of bond pads 111 may be formed on the semiconductor die 110, and a die passivation layer 112 may be formed to cover a top portion of the semiconductor die 110 while partially exposing the bond pads 111. The semiconductor die 110 is generally made of a silicon material. In addition, the bond pads 111 may comprise one or more of: copper, aluminum and similar materials, for example, and the die passivation layer 112 may comprise, for example, an inorganic layers such as, for example, a nitride layer ($Si_3N_4$), an oxide layer (SiO2) or similar materials, but aspects of the present disclosure are not limited thereto.

Referring to FIGS. 9 and 10B, in step S2, a redistribution layer (RDL) 120 may be formed on the semiconductor die 110. Here, the RDL 120 may be electrically connected to the bond pads 111 exposed by the die passivation layer 112. Although not shown, the RDL 120 may be formed by forming an RDL seed layer on the semiconductor die 110 by electroless plating and allowing current to flow to the RDL seed layer to perform electroplating thereon. The RDL 120 may comprise copper or a similar material, for example.

Referring to FIGS. 9 and 10C, in step S3, a passivation layer 130 may be formed to expose the connection region 121 of the RDL 120. The passivation layer 130 may cover a top portion of the RDL 120. The passivation layer 130 may comprise an opening 131, and the connection region 121 of the RDL 120 may be exposed by the opening 131, as may be a portion of the die passivation layer 112. Thereafter, the RDL 120 may be electrically connected to the UBM 150 through the opening 131. The passivation layer 130 may be formed of an organic layer such as polyimide (PI), benzo cyclo butane (BCB), poly benz oxazole (PBO), bismaleimide triazine (BT), a phenolic resin, epoxy, for example, and similar materials, but embodiments of the present disclosure are not limited to the material of the passivation layer 130 listed herein. Meanwhile, the forming of the passivation layer (S3) may be excluded in some cases.

Referring to FIGS. 9 and 10D, in step S4, a UBM seed layer 140' may be formed on the entire surface of the passivation layer 130. In instances where the passivation layer (S3) is not formed, the UBM seed layer 140' may be formed on the semiconductor die 110 and the RDL 120. The UBM seed layer 140' may include copper or similar material, for example, and may be formed by an electroless plating process.

Referring to FIGS. 9 and 10E, in step S5, a photoresist PR for forming patterns is formed on the UBM seed layer 140'. The photoresist PR may be formed only on a region excluding a potential region where the UBM 150 is to be formed in a later stage. Accordingly, the photoresist PR may be formed on the region excluding the connection region 121 of the RDL 120 and a region corresponding to the opening 131 of the passivation layer 130.

Referring to FIGS. 9 and 10F, in step S6, the UBM 150 may be formed between the patterns of the photoresist PR. The UBM 150 may be formed by applying a current to the UBM seed layer 140' as a seed to perform electroplating. The UBM 150 may comprise chrome/chrome-copper alloy/copper (Cr/Cr—Cu/Cu), titanium-tungsten alloy/copper (Ti—W/Cu), aluminum/nickel/copper (Al/Ni/Cu), or similar materials, for example.

Referring to FIGS. 9 and 10G, in step S7, the photoresist PR may be removed. The photoresist PR may be removed by ashing, for example, but aspects of the present disclosure are not limited thereto.

Referring to FIGS. 9 and 10H, in step S8, the UBM seed layer 140' in the region without the UBM 150 formed thereon may be etched. Therefore, the UBM seed layer 140 remains only under the UBM 150. At this stage, a top portion of the UBM 150 may also be removed to some extent. However, since the UBM 150 is much thicker than the UBM seed layer 140', the UBM seed layer 140' in the region without the UBM 150 formed thereon may be entirely removed while the UBM 150 is partially removed.

Referring to FIGS. 9 and 10I, in step S9, a bump 160 may be coupled to the UBM 150. The bump 160 may comprise a conductive pillar 161 and a solder cap 162. The conductive pillar 161 may be comprise copper or similar material, and the solder cap 162 may comprise tin/lead (Sn/Pb), leadless Sn, or similar material, for example, but is not limited thereto.

This disclosure provides example embodiments supporting the present disclosure. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure. It should be noted the process flow of FIG. 9 may be utilized for each of the embodiments shown in FIGS. 1-10 with added or removed steps where applicable, such as when multiple dielectric layers are formed.

In an example embodiment of the disclosure, a semiconductor device with fine pitch redistribution layers comprises a semiconductor die comprising a bond pad and a first passivation layer covering a first surface of the semiconductor die, the first passivation layer comprising an opening above the bond pad. A redistribution layer (RDL) may be formed on the first passivation layer with one end of the RDL electrically coupled to the bond pad and a second end comprising a connection region and a second passivation layer may be formed on the RDL and a portion of the first passivation layer with an opening in the second passivation layer for the connection region of the RDL.

An under bump metal (UBM) may be formed on the connection region of the RDL and a portion of the second passivation layer. A bump contact may be formed on the UBM, wherein a width of the RDL is less than a width of the opening in the second passivation layer and is constant from the bond pad through at least a portion of the opening. The bump contact may comprise a copper pillar, solder ball, lead wafer bump, or lead-free wafer bump. The bump contact may comprise a solder cap on the copper pillar. The connection region may comprise a region of the RDL that is in contact with the UBM.

In an example scenario, a lead free wafer interconnect may be formed using the following steps: (a) forming an under bump metallization (UBM) structure by (i) forming a layer of titanium (Ti) or titanium-tungsten (TiW) by sputtering, (ii) forming a layer of copper (Cu) on the titanium or titanium-tungsten layer by sputtering, (iii) and forming a layer of nickel (Ni) on the copper layer by electroplating; and (b) forming a lead free solder material on the nickel layer of the UBM structure by electroplating, wherein the lead free solder material has a composition by weight of 1% to 4% silver (Ag) and the remainder of the composition by weight being tin (Sn).

In another example scenario, a copper pillar may be formed using the following layers: (a) an under bump metallization ("UBM") structure that includes (i) a layer of titanium-tungsten (TiW) formed by sputtering (may be referred to as a "seed layer"), and (ii) a layer of copper (Cu) on the titanium-tungsten layer formed by sputtering, (b) a copper pillar formed on the UBM by electroplating, and (c) a layer of solder formed on the copper pillar or a layer of nickel formed on the copper pillar with a layer of solder formed on the nickel layer The connection region may be centered beneath the bump contact. A seed layer may be under the UBM and on the connection region of the RDL and a portion of the second passivation layer. The RDL may extend to a center of the opening. A third passivation layer may be formed between the first passivation layer and the RDL. A width of the RDL may be 10 microns or less and the UBM may comprise a 25 micron×45 micron oval or less. A width of the RDL may be 10 microns or less and the UBM may comprise a 25 micron or less circle.

The present disclosure provides a semiconductor device, which can easily secure a space in designing a path of a redistribution layer by forming a connection region of a redistribution layer, where an under bump metal (UBM) is formed, and the other region so as to have the same width, and a manufacturing method of the semiconductor device.

According to an embodiment of the present disclosure, there is provided a semiconductor device including a semiconductor die having a plurality of bond pads, a redistribution layer formed on the semiconductor die and having an end electrically connected to the bond pads, an under bump metal (UBM) formed at the other end of the redistribution layer and electrically connected to the redistribution layer, and a bump connected to the UBM, wherein the redistribution layer is formed to have the same width at a connection region where the UBM is formed and at a region other than the connection region.

The redistribution layer may be formed to extend from the one end longer than a region corresponding to the UBM. The redistribution layer may be formed to extend from the one end to a region corresponding to the UBM. The connection region may be positioned at the center of the other end of the redistribution layer. The connection region may be positioned at an end of the other end of the redistribution layer. A passivation layer including an opening for exposing the connection region may be formed on the redistribution layer. The opening may expose the semiconductor die positioned in vicinity of the connection region. The opening may have a larger area than the connection region. The opening may be formed at a position corresponding to the center of the other end of the redistribution layer. The opening may be formed at a position corresponding to the end of the other end of the redistribution layer.

The UBM may coves the opening of the passivation layer and a region positioned in vicinity of the opening. The UBM may be formed by electroplating using a UBM seed layer formed on the connection region as a seed. The UBM seed layer may cover the connection region and the semiconductor die positioned in vicinity of the connection region. The UBM seed layer may cover a top surface and lateral surfaces of the connection region. The UBM seed layer may have a larger area than the connection region. The UBM may cover the connection region and the semiconductor die positioned in vicinity of the connection region. The UBM may cover a top surface and lateral surfaces of the connection region. The UBM may have a larger area than the connection region. A passivation layer exposing the bond pad may be interposed between the semiconductor die and the redistribution layer.

As described above, in the semiconductor device and the manufacturing method thereof according to the present disclosure, a space for designing a path of the redistribution layer can be easily secured by forming a connection region of the redistribution layer, where an UBM is formed, and a region other than the connection region, so as to have the same width, thereby minimizing an electric short to another RDL adjacent to the connection region while increasing the degree of freedom in designing the redistribution layer.

While various aspects supporting the disclosure have been described with reference to certain example embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular example embodiments disclosed, but that the present disclosure will include all embodiments falling within the scope of the appended claims.

What is claimed is:

1. A semiconductor device comprising:
a semiconductor die comprising a bond pad;
a first passivation layer covering a first surface of the semiconductor die, the first passivation layer comprising a first opening above the bond pad;
a redistribution layer (RDL), comprising an RDL trace, on the first passivation layer with one end of the RDL trace electrically coupled to the bond pad and a second end comprising a connection region;
a second passivation layer on the RDL and on a portion of the first passivation layer, the second passivation layer comprising a second opening for the connection region of the RDL trace;
an under bump metal (UBM) on the connection region of the RDL trace and a portion of the second passivation layer; and
a bump contact on the UBM, wherein a width of the RDL trace where the RDL trace aligns with the second opening is less than a width of the second opening.

2. The semiconductor device according to claim 1, wherein the width of the RDL trace is constant from the bond pad through at least a portion of the second opening.

3. The semiconductor device according to claim 1, wherein the UBM is on a portion of the first passivation layer.

4. The semiconductor device according to claim 1, wherein the connection region comprises a region of the RDL trace that is in contact with the UBM.

5. The semiconductor device according to claim 1, wherein the connection region extends partially underneath the bump contact.

6. The semiconductor device according to claim 1, wherein a seed layer is under the UBM and on the connection region of the RDL trace and a portion of the second passivation layer.

7. The semiconductor device according to claim 1, wherein the RDL trace does not extend all the way through the second opening.

8. The semiconductor device according to claim 1, comprising a third passivation layer between the first passivation layer and the RDL.

9. The semiconductor device according to claim 1, wherein a width of the RDL trace is less than or equal to 10 microns and the UBM comprises an oval having a minor axis of less than or equal to 25 microns.

10. The semiconductor device according to claim 1, wherein a width of the RDL trace is less than or equal to 10 microns and the UBM comprises a circle with a diameter of 25 microns or less.

11. A semiconductor device comprising:
a redistribution layer (RDL) on a semiconductor die comprising a first RDL trace, a second RDL trace, and a third RDL trace;
a first under bump metal (UBM) on the first RDL trace; and
a second UBM on the second RDL trace;
wherein the third RDL trace is between the first and second RDL traces, the third RDL trace is positioned between the first and second UBMs with a substantially 55 micron or less pitch between adjacent RDL traces, and the pitch between the adjacent RDL traces remains substantially constant in an area under and between the first and second UBMs.

12. The semiconductor device of claim 11, wherein the first and second UBMs are circular.

13. The semiconductor device of claim 11, wherein the first and second UBMs are oval shaped.

14. A method of fabricating a semiconductor device, the method comprising:
receiving a semiconductor die comprising a bond pad, wherein a first passivation layer covers a first surface of the semiconductor die and comprises a first opening above the bond pad;
electrically coupling the bond pad to an under bump metal (UBM) utilizing a redistribution layer (RDL), comprising an RDL trace, on the first passivation layer, wherein an end portion of the RDL trace comprises a connection region;
covering the RDL and the first passivation layer with a second passivation layer, the second passivation layer having a second opening for the connection region of the RDL trace; and
forming a bump contact on the UBM, wherein a width of the RDL trace where the RDL trace aligns with the second opening is less than a width of the second opening.

15. The method according to claim 14, wherein the width of the RDL trace is constant from the bond pad through at least a portion of the second opening.

16. The method according to claim 14, wherein the UBM is on a portion of the first passivation layer.

17. The method according to claim 14, wherein the connection region comprises a region of the RDL trace that is in contact with the UBM.

18. The method according to claim 14, wherein the connection region extends partially underneath the bump contact.

19. The method according to claim 14, wherein the RDL trace does not extend all the way through the second opening.

20. The method according to claim 14, comprising forming a third passivation layer on the first passivation layer before forming the RDL.

21. The semiconductor device according to claim 1, wherein the second opening is an only opening in the second passivation layer through which the UBM is coupled to the RDL trace.

22. The semiconductor device according to claim 1, wherein the UBM straddles a top surface and opposite side surfaces of the RDL trace in the connection region.

23. The semiconductor device according to claim 11, wherein the first UBM electrically connects to the first RDL via a first single opening in a passivation layer, and the second UBM electrically connects to the first RDL via a second single opening in the passivation layer.

24. The semiconductor device according to claim 11, wherein a width of the first RDL trace, the second RDL trace, and the third RDL trace remains substantially constant in an area under and between the first UBM and the second UBM.

\* \* \* \* \*